United States Patent
Sreenivasan et al.

(10) Patent No.: US 8,142,850 B2
(45) Date of Patent: Mar. 27, 2012

(54) PATTERNING A PLURALITY OF FIELDS ON A SUBSTRATE TO COMPENSATE FOR DIFFERING EVAPORATION TIMES

(75) Inventors: Sidlgata V. Sreenivasan, Austin, TX (US); Philip D. Schumaker, Austin, TX (US)

(73) Assignee: Molecular Imprints, Inc., Austin, TX (US)

(*) Notice: Subject to any disclaimer, the term of this patent is extended or adjusted under 35 U.S.C. 154(b) by 833 days.

(21) Appl. No.: 11/692,450

(22) Filed: Mar. 28, 2007

(65) Prior Publication Data
US 2007/0231981 A1 Oct. 4, 2007

Related U.S. Application Data

(60) Provisional application No. 60/788,782, filed on Apr. 3, 2006.

(51) Int. Cl.
| | |
|---|---|
| B05D 3/00 | (2006.01) |
| B05D 5/00 | (2006.01) |
| B05D 5/12 | (2006.01) |
| H01L 21/84 | (2006.01) |
| B31F 1/07 | (2006.01) |
| B44C 1/24 | (2006.01) |
| B41D 7/00 | (2006.01) |
| B41D 1/06 | (2006.01) |

(52) U.S. Cl. ........ 427/271; 427/264; 427/270; 427/275; 427/276; 427/97.3; 427/98.4; 427/96.1; 438/158; 101/3.1; 101/32; 101/33; 101/34

(58) Field of Classification Search .............. 427/96.1, 427/97.3, 98.4, 264, 270–271, 275–276; 101/3.1, 32–34
See application file for complete search history.

(56) References Cited

U.S. PATENT DOCUMENTS
1,000,000 A 8/1911 Holton
(Continued)

FOREIGN PATENT DOCUMENTS
EP 0398589 4/1998
(Continued)

OTHER PUBLICATIONS

Johnson et al., Advances in Step and Flash Imprint Lithography, SPEI Microlithography Conference Feb. 23, 2003.
(Continued)

*Primary Examiner* — Timothy Meeks
*Assistant Examiner* — Mandy Louie
(74) *Attorney, Agent, or Firm* — Cameron A. King (57) ABSTRACT

A method of patterning a substrate comprising a plurality of fields, including, inter alia, positioning a first volume of fluid on a first subset of the plurality of fields of the substrate, with the first volume of fluid being subjected to a first evaporation time; positioning a second volume of fluid on a second subset of the plurality of fields of the substrate, differing from the first subset, with the second volume of fluid being subjected to a second evaporation time, differing from the first evaporation time; and patterning the first and second subsets of the plurality of fields, with the first subset of the plurality of fields being patterned prior to the second subset of the plurality of fields being patterned, with a volume associated with the second subset of the plurality of fields being greater than a volume associated with the first subset of the plurality of fields to compensate for the second evaporation time being greater than the first evaporation time.

21 Claims, 3 Drawing Sheets

U.S. PATENT DOCUMENTS

| | | |
|---|---|---|
| 1,236,304 A | 9/1917 | Howell |
| 2,000,000 A | 4/1935 | Ledwinka |
| 3,000,000 A | 9/1961 | Eldredge |
| 3,503,538 A | 3/1970 | Barnes |
| 3,781,214 A | 12/1973 | Nemoto et al. |
| 4,022,855 A | 5/1977 | Hamblen |
| 4,070,116 A | 1/1978 | Frosch et al. |
| 4,208,240 A | 6/1980 | Latos |
| 4,364,971 A | 12/1982 | Sack et al. |
| 4,440,804 A | 4/1984 | Milgram |
| 4,512,848 A | 4/1985 | Deckman et al. |
| 4,521,445 A | 6/1985 | Nablo et al. |
| 4,552,832 A | 11/1985 | Blume et al. |
| 4,576,900 A | 3/1986 | Chiang |
| 4,637,904 A | 1/1987 | Rounds |
| 4,676,868 A | 6/1987 | Riley et al. |
| 4,707,218 A | 11/1987 | Giammarco et al. |
| 4,731,155 A | 3/1988 | Napoli et al. |
| 4,737,425 A | 4/1988 | Lin et al. |
| 4,848,911 A | 7/1989 | Uchida et al. |
| 4,857,477 A | 8/1989 | Kanamori |
| 4,862,019 A | 8/1989 | Ashmore, Jr. |
| 4,866,307 A | 9/1989 | Ashmore, Jr. |
| 4,908,298 A | 3/1990 | Hefferon et al. |
| 4,909,151 A | 3/1990 | Fukui et al. |
| 4,919,748 A | 4/1990 | Bredbenner et al. |
| 4,921,778 A | 5/1990 | Thackeray et al. |
| 4,932,358 A | 6/1990 | Studley et al. |
| 4,936,465 A | 6/1990 | Zold |
| 4,957,663 A | 9/1990 | Zwiers et al. |
| 4,959,252 A | 9/1990 | Bonnebat et al. |
| 4,964,945 A | 10/1990 | Calhoun |
| 4,980,316 A | 12/1990 | Huebner |
| 5,003,062 A | 3/1991 | Yen |
| 5,028,361 A | 7/1991 | Fujimoto |
| 5,028,366 A | 7/1991 | Harakal et al. |
| 5,053,318 A | 10/1991 | Gulla et al. |
| 5,073,230 A | 12/1991 | Maracas et al. |
| 5,110,514 A | 5/1992 | Soane |
| 5,124,089 A | 6/1992 | Ohkoshi et al. |
| 5,126,006 A | 6/1992 | Cronin et al. |
| 5,148,037 A | 9/1992 | Suda et al. |
| 5,151,754 A | 9/1992 | Ishibashi et al. |
| 5,212,147 A | 5/1993 | Sheats |
| 5,232,874 A | 8/1993 | Rhodes et al. |
| 5,240,550 A | 8/1993 | Boehnke et al. |
| 5,240,878 A | 8/1993 | Fitzsimmons et al. |
| 5,244,818 A | 9/1993 | Jokerst et al. |
| 5,246,880 A | 9/1993 | Reele et al. |
| 5,250,472 A | 10/1993 | Chen et al. |
| 5,259,926 A | 11/1993 | Kuwabara et al. |
| 5,277,749 A | 1/1994 | Griffith et al. |
| 5,288,436 A | 2/1994 | Liu et al. |
| 5,320,273 A * | 6/1994 | Goenka et al. ............... 228/33 |
| 5,324,683 A | 6/1994 | Fitch et al. |
| 5,328,810 A | 7/1994 | Lowrey et al. |
| 5,330,881 A | 7/1994 | Sidman et al. |
| 5,357,122 A | 10/1994 | Okubora et al. |
| 5,362,606 A | 11/1994 | Hartney et al. |
| 5,362,940 A | 11/1994 | MacDonald et al. |
| 5,364,222 A | 11/1994 | Akimoto et al. |
| 5,366,851 A | 11/1994 | Novembre |
| 5,371,822 A | 12/1994 | Horwitz et al. |
| 5,374,327 A | 12/1994 | Imahashi et al. |
| 5,376,810 A | 12/1994 | Hoenk et al. |
| 5,422,295 A | 6/1995 | Choi et al. |
| 5,424,549 A | 6/1995 | Feldman |
| 5,425,848 A | 6/1995 | Haisma et al. |
| 5,431,777 A | 7/1995 | Austin et al. |
| 5,434,107 A | 7/1995 | Paranjpe |
| 5,445,195 A | 8/1995 | Kim |
| 5,449,117 A | 9/1995 | Muderlak et al. |
| 5,451,435 A | 9/1995 | Yu |
| 5,453,157 A | 9/1995 | Jeng |
| 5,458,520 A | 10/1995 | DeMercurio et al. |
| 5,468,542 A | 11/1995 | Crouch |
| 5,480,047 A | 1/1996 | Tanigawa et al. |
| 5,512,131 A | 4/1996 | Kumar et al. |
| 5,542,605 A | 8/1996 | Campau |
| 5,545,367 A | 8/1996 | Bae et al. |
| 5,601,641 A | 2/1997 | Stephens |
| 5,612,068 A | 3/1997 | Kempf et al. |
| 5,628,917 A | 5/1997 | MacDonald et al. |
| 5,643,364 A | 7/1997 | Zhao et al. |
| 5,654,238 A | 8/1997 | Cronin et al. |
| 5,669,303 A | 9/1997 | Maracas et al. |
| 5,723,176 A | 3/1998 | Keyworth et al. |
| 5,736,424 A | 4/1998 | Prybyla et al. |
| 5,753,014 A | 5/1998 | Van Rijn |
| 5,772,905 A | 6/1998 | Chou |
| 5,776,748 A | 7/1998 | Singhvi et al. |
| 5,804,474 A | 9/1998 | Sakaki et al. |
| 5,812,629 A | 9/1998 | Clauser |
| 5,817,579 A | 10/1998 | Ko et al. |
| 5,820,769 A | 10/1998 | Chou |
| 5,843,363 A | 12/1998 | Mitwalsky et al. |
| 5,849,209 A | 12/1998 | Kindt-Larsen et al. |
| 5,849,222 A | 12/1998 | Jen et al. |
| 5,858,580 A | 1/1999 | Wang et al. |
| 5,888,650 A | 3/1999 | Calhoun et al. |
| 5,895,263 A | 4/1999 | Carter et al. |
| 5,900,160 A | 5/1999 | Whitesides et al. |
| 5,907,782 A | 5/1999 | Wu |
| 5,926,690 A | 7/1999 | Toprac et al. |
| 5,948,470 A | 9/1999 | Harrison et al. |
| 5,948,570 A | 9/1999 | Kornblit et al. |
| 5,956,216 A | 9/1999 | Chou |
| 5,974,150 A | 10/1999 | Kaish et al. |
| 5,983,906 A | 11/1999 | Zhao et al. |
| 6,027,595 A | 2/2000 | Suleski |
| 6,046,056 A | 4/2000 | Parce et al. |
| 6,048,623 A | 4/2000 | Everhart et al. |
| 6,048,799 A | 4/2000 | Prybyla |
| 6,067,144 A | 5/2000 | Murouchi |
| 6,074,827 A | 6/2000 | Nelson et al. |
| 6,089,853 A | 7/2000 | Biebuyck et al. |
| 6,150,680 A | 11/2000 | Eastman et al. |
| 6,180,239 B1 | 1/2001 | Whitesides et al. |
| 6,218,316 B1 | 4/2001 | Marsh |
| 6,242,363 B1 | 6/2001 | Zhang |
| 6,245,213 B1 | 6/2001 | Olsson et al. |
| 6,274,294 B1 | 8/2001 | Hines |
| 6,279,474 B1 | 8/2001 | Liebl |
| 6,306,467 B1 | 10/2001 | White et al. |
| 6,309,580 B1 | 10/2001 | Chou |
| 6,326,627 B1 | 12/2001 | Putvinski et al. |
| 6,329,256 B1 | 12/2001 | Ibok |
| 6,334,960 B1 | 1/2002 | Willson et al. |
| 6,337,262 B1 | 1/2002 | Pradeep et al. |
| 6,348,999 B1 | 2/2002 | Summersgill et al. |
| 6,355,198 B1 | 3/2002 | Kim et al. |
| 6,376,379 B1 | 4/2002 | Quek et al. |
| 6,383,928 B1 | 5/2002 | Eissa |
| 6,387,330 B1 | 5/2002 | Bova et al. |
| 6,387,783 B1 | 5/2002 | Furukawa et al. |
| 6,388,253 B1 | 5/2002 | Su |
| 6,391,217 B2 | 5/2002 | Schaffer et al. |
| 6,391,798 B1 | 5/2002 | DeFelice et al. |
| 6,423,207 B1 | 7/2002 | Heidari et al. |
| 6,482,742 B1 | 11/2002 | Chou |
| 6,495,907 B1 | 12/2002 | Jain et al. |
| 6,498,640 B1 | 12/2002 | Ziger |
| 6,503,829 B2 | 1/2003 | Kim et al. |
| 6,514,672 B2 | 2/2003 | Tsai et al. |
| 6,517,977 B2 | 2/2003 | Resnick et al. |
| 6,517,995 B1 | 2/2003 | Jacobson et al. |
| 6,518,189 B1 | 2/2003 | Chou |
| 6,521,536 B1 | 2/2003 | Robinson |
| 6,534,418 B1 | 3/2003 | Plat et al. |
| 6,541,360 B1 | 4/2003 | Lyons et al. |
| 6,565,928 B2 | 5/2003 | Sakamoto et al. |
| 6,580,172 B2 | 6/2003 | Mancini et al. |
| 6,586,268 B1 | 7/2003 | Kopola et al. |
| 6,593,240 B1 | 7/2003 | Page |
| 6,621,960 B2 | 9/2003 | Wang et al. |

| | | |
|---|---|---|
| 6,623,579 B1 | 9/2003 | Smith et al. |
| 6,627,544 B2 | 9/2003 | Izumi et al. |
| 6,629,292 B1 | 9/2003 | Corson et al. |
| 6,632,742 B2 | 10/2003 | Yang et al. |
| 6,635,581 B2 | 10/2003 | Wong |
| 6,646,662 B1 | 11/2003 | Nebashi et al. |
| 6,665,014 B1 | 12/2003 | Assadi et al. |
| 6,677,252 B2 | 1/2004 | Marsh |
| 6,678,038 B2 | 1/2004 | Binnard |
| 6,696,220 B2 | 2/2004 | Bailey et al. |
| 6,713,238 B1 | 3/2004 | Chou et al. |
| 6,719,915 B2 | 4/2004 | Willson et al. |
| 6,776,094 B1 | 8/2004 | Whitesides et al. |
| 6,809,356 B2 | 10/2004 | Chou |
| 6,828,244 B2 | 12/2004 | Chou |
| 6,833,325 B2 | 12/2004 | Huang et al. |
| 6,849,558 B2 | 2/2005 | Schaper |
| 6,855,293 B1 | 2/2005 | Zengerle et al. |
| 6,870,301 B2 | 3/2005 | Choi et al. |
| 6,870,584 B2 | 3/2005 | Kawase et al. |
| 6,873,087 B1 | 3/2005 | Choi et al. |
| 6,879,162 B2 | 4/2005 | Aguero et al. |
| 6,900,881 B2 | 5/2005 | Sreenivasan et al. |
| 6,908,861 B2 | 6/2005 | Sreenivasan et al. |
| 6,916,584 B2 | 7/2005 | Sreenivasan et al. |
| 6,916,585 B2 | 7/2005 | Sreenivasan et al. |
| 6,932,934 B2 | 8/2005 | Choi et al. |
| 6,936,194 B2 | 8/2005 | Watts |
| 6,946,360 B2 | 9/2005 | Chou |
| 6,955,767 B2 | 10/2005 | Chen |
| 6,964,793 B2 | 11/2005 | Willson et al. |
| 6,986,975 B2 | 1/2006 | Sreenivasan et al. |
| 7,027,156 B2 | 4/2006 | Watts et al. |
| 7,037,639 B2 | 5/2006 | Voisin |
| 7,070,405 B2 | 7/2006 | Sreenivasan et al. |
| 7,071,088 B2 | 7/2006 | Watts et al. |
| 7,077,992 B2 | 7/2006 | Sreenivasan et al. |
| 7,105,452 B2 | 9/2006 | Sreenivasan |
| 7,117,583 B2 | 10/2006 | Dinan et al. |
| 7,122,482 B2 | 10/2006 | Xu et al. |
| 7,128,875 B2 | 10/2006 | Cubicciotti |
| 7,136,150 B2 | 11/2006 | Sreenivasan et al. |
| 7,214,624 B2 | 5/2007 | Fujita et al. |
| 7,244,386 B2 | 7/2007 | Sreenivasan et al. |
| 7,281,919 B2 | 10/2007 | Shackleton et al. |
| 7,281,921 B2 | 10/2007 | Watts et al. |
| 7,282,550 B2 | 10/2007 | Xu et al. |
| 7,309,225 B2 | 12/2007 | McMackin et al. |
| 7,360,851 B1 | 4/2008 | Snyder |
| 2001/0008310 A1* | 7/2001 | Sakuyama et al. ............ 257/737 |
| 2001/0023829 A1 | 9/2001 | Olsson et al. |
| 2002/0038916 A1 | 4/2002 | Chiu et al. |
| 2002/0042027 A1 | 4/2002 | Chou et al. |
| 2002/0094496 A1 | 7/2002 | Choi et al. |
| 2002/0110992 A1 | 8/2002 | Ho |
| 2002/0111036 A1 | 8/2002 | Zhu et al. |
| 2002/0122873 A1 | 9/2002 | Mirkin et al. |
| 2002/0132482 A1 | 9/2002 | Chou |
| 2002/0116857 A1 | 11/2002 | Wang et al. |
| 2002/0167117 A1 | 11/2002 | Chou |
| 2002/0170880 A1 | 11/2002 | Chen |
| 2002/0191141 A1 | 12/2002 | Liao |
| 2003/0025895 A1 | 2/2003 | Binnard |
| 2003/0030766 A1* | 2/2003 | Kiguchi et al. ............... 349/106 |
| 2003/0034329 A1 | 2/2003 | Chou |
| 2003/0062334 A1 | 4/2003 | Lee et al. |
| 2003/0080471 A1 | 5/2003 | Chou |
| 2003/0080472 A1 | 5/2003 | Chou |
| 2003/0081193 A1 | 5/2003 | White et al. |
| 2003/0092261 A1 | 5/2003 | Kondo et al. |
| 2003/0129542 A1 | 7/2003 | Shih et al. |
| 2003/0137494 A1 | 7/2003 | Tulbert |
| 2003/0151714 A1 | 8/2003 | Takahashi et al. |
| 2003/0174435 A1 | 9/2003 | Dinan et al. |
| 2003/0179354 A1 | 9/2003 | Araki et al. |
| 2003/0184917 A1 | 10/2003 | Chang et al. |
| 2003/0186140 A1 | 10/2003 | Fries |
| 2003/0197312 A1 | 10/2003 | Hougham et al. |
| 2003/0224116 A1 | 12/2003 | Chen et al. |
| 2004/0029041 A1* | 2/2004 | Shih et al. .................. 430/271.1 |
| 2004/0036201 A1 | 2/2004 | Chou et al. |
| 2004/0046288 A1 | 3/2004 | Chou |
| 2004/0058067 A1 | 3/2004 | Law et al. |
| 2004/0065252 A1 | 4/2004 | Sreenivasan et al. |
| 2004/0065976 A1 | 4/2004 | Sreenivasan et al. |
| 2004/0110856 A1 | 6/2004 | Young et al. |
| 2004/0118809 A1 | 6/2004 | Chou et al. |
| 2004/0131718 A1 | 7/2004 | Chou et al. |
| 2004/0137734 A1 | 7/2004 | Chou et al. |
| 2004/0146792 A1 | 7/2004 | Nimmakayala et al. |
| 2004/0156108 A1 | 8/2004 | Chou et al. |
| 2004/0192041 A1 | 9/2004 | Jeong et al. |
| 2004/0197843 A1 | 10/2004 | Chou et al. |
| 2004/0201890 A1 | 10/2004 | Crosby |
| 2004/0231781 A1 | 11/2004 | Bao et al. |
| 2004/0250945 A1 | 12/2004 | Zheng et al. |
| 2004/0261703 A1 | 12/2004 | Kobrin et al. |
| 2005/0037143 A1 | 2/2005 | Chou et al. |
| 2005/0056963 A1 | 3/2005 | McCutcheon |
| 2005/0064344 A1 | 3/2005 | Bailey et al. |
| 2005/0084804 A1 | 4/2005 | Truskett et al. |
| 2005/0106321 A1* | 5/2005 | McMackin et al. ........... 427/258 |
| 2005/0145119 A1 | 7/2005 | Tan et al. |
| 2005/0156353 A1 | 7/2005 | Watts et al. |
| 2005/0156357 A1 | 7/2005 | Willson et al. |
| 2005/0160011 A1 | 7/2005 | Sreenivasan et al. |
| 2005/0170670 A1 | 8/2005 | King et al. |
| 2005/0176242 A1 | 8/2005 | Kawase |
| 2005/0189676 A1* | 9/2005 | Sreenivasan .................. 264/225 |
| 2005/0230882 A1 | 10/2005 | Watts et al. |
| 2005/0236739 A1 | 10/2005 | Willson et al. |
| 2005/0253137 A1 | 11/2005 | Whang et al. |
| 2005/0253307 A1 | 11/2005 | Sreenivasan |
| 2005/0270312 A1 | 12/2005 | Lad et al. |
| 2005/0276919 A1 | 12/2005 | Truskett et al. |
| 2005/0284886 A1 | 12/2005 | Penciu |
| 2006/0017876 A1 | 1/2006 | Watts |
| 2006/0019183 A1 | 1/2006 | Voisin |
| 2006/0035029 A1 | 2/2006 | Xu et al. |
| 2006/0062867 A1 | 3/2006 | Choi et al. |
| 2006/0076717 A1 | 4/2006 | Sreenivasan et al. |
| 2006/0077374 A1 | 4/2006 | Sreenivasan et al. |
| 2006/0113697 A1 | 6/2006 | Sreenivasan |
| 2006/0121728 A1 | 6/2006 | McMackin et al. |
| 2006/0125154 A1 | 6/2006 | Watts et al. |
| 2006/0213441 A1 | 9/2006 | Kobrin et al. |
| 2007/0122942 A1 | 5/2007 | Sreenivasan et al. |
| 2007/0126150 A1 | 6/2007 | GanapathiSubramanian et al. |
| 2007/0132152 A1 | 6/2007 | Choi et al. |
| 2007/0170617 A1 | 7/2007 | Choi et al. |
| 2007/0228593 A1 | 10/2007 | Jones et al. |
| 2007/0228609 A1 | 10/2007 | Sreenivasan et al. |
| 2007/0228610 A1 | 10/2007 | Sreenivasan et al. |
| 2007/0243655 A1 | 10/2007 | Schmid et al. |

FOREIGN PATENT DOCUMENTS

| | | |
|---|---|---|
| FR | 2677043 A1 | 12/1992 |
| JP | 3-32888 | 2/1981 |
| JP | 58-129074 | 8/1983 |
| JP | 1-196749 | 8/1989 |
| JP | 02-24848 | 1/1990 |
| JP | 02-92603 | 4/1990 |
| JP | 02192045 | 7/1990 |
| JP | 4-70379 | 5/1992 |
| WO | WO 87/02935 | 5/1987 |
| WO | WO 98/10121 | 3/1998 |
| WO | WO 99/05724 | 2/1999 |
| WO | WO 99/45753 | 9/1999 |
| WO | WO 00/21689 | 4/2000 |
| WO | WO 01/47003 | 6/2001 |
| WO | WO 01/63361 | 8/2001 |
| WO | WO 01/69317 | 9/2001 |
| WO | WO 01/79589 | 10/2001 |
| WO | WO 01/79933 | 10/2001 |
| WO | WO 02/22916 | 3/2002 |
| WO | WO 02/24977 | 3/2002 |

OTHER PUBLICATIONS

Chou et al., Lithographically Induced Self-assembly of Periodic Polymer Micropillar Arrays, J. Vac. Sci. Technol. B 17 (6), pp. 3197-3202 Nov. 1, 1999.
Colburn et al., Step and Flash Imprint Lithography: A New Approach to High-Resolution Patterning, Proc. Of SPIE, vol. 3676 Mar. 1, 1999.
Wu, Large Area High Density Quantized Magnetic Disks Fabricated Using Nanoimprint Lithography, J. Vac. Sci. Technol. B 16(6), pp. 3825-3829 Nov. 1, 1998.
Gokan et al., Dry Etch Resistance of Organic Materials, J. Electrochem. Soc.: Solid-State Science and Technology, pp. 143-146 Jan. 1, 1983.
Chou, Nanoimprint Lithography and Lithographically Induced Self-Assembly, Mrs Bulletin, pp. 512-517 Jul. 1, 2001.
Braeuer et al., Precise Polymer Micro-Optical Systems, Mrs Bulletin, pp. 519-522 Jul. 1, 2001.
Choi et al., Design of Orientation Stages for Step and Flash Imprint Lithography, Precision Engineering, pp. 192-199 Jan. 1, 2001.
Ruchhoeft et al., Patterning Curved Surfaces: Template Generation by Ion Beam Proximity Lithography and Relief Transfer by Step and Flash Imprint Lithography, Journal of Vacuum Science and Technology, pp. 1-17 Jan. 1, 2000.
Xia et al., Soft Lithography, Angew. Chem. Int. Ed., pp. 550-575 Jan. 1, 1998.
Chou et al., Imprint Lithography with Sub-10 nm Feature Size and High Throughput, Microelectronic Engineering 35, pp. 237-240 Jan. 1, 1997.
Haisma et al., Mold-assisted Nanolithography: A Process for Reliable Pattern Replication, J. Vac. Sci. Technol. B, pp. 4124-4128 Nov. 1, 1996.
Xia et al., Soft Lithography, Annu Rev. Mater Sci. 1998 28: 153-184 Jan. 1, 1998.
Chou et al., Imprint of Sub-25 nm Vias and Trenches in Polymers, Appl. Phys. Lett. 67 (21) Nov. 20, 1995.
Otto et al., Characterization and Application of a UV-based Imprint Technique, Microelectronic Engineering 57-58, pp. 361-366 Jan. 1, 2001.
Nguyen, Asymmetric Fluid-Structure Dynamics in Nanoscale Imprint Lithography, The University of Texas at Austin, pp. 1-111 Aug. 1, 2001.
Colburn et al., Step and Flash Imprint Lithography for sub-100 nm Patterning, Proceedings of SPIE vol. 3997, pp. 453-457 Jan. 1, 2000.
Chou et al., Imprint Lithography with 25-Nanometer Resolution, Science vol. 272, pp. 85-87 Apr. 5, 1996.
Heidari, Nanoimprint Lithography at the 6 in. Wafer Scale, J. Vac. Sci. Technol. B 18(6), pp. 3557-3560 Nov. 1, 2000.
Abstract of Japanese Patent 02-92603, Aug. 12, 2004.
Translation of Japanese Patent 02-92603, Apr. 3, 1990.
Translation of Japanese Patent 02-24848, Jan. 26, 1990.
Abstract of Japanese Patent 02-24848, Jan. 26, 1990.
Otto et al., Reproducibility and Homogeneity in Step and Repeat UV-Nanoimprint Lithography, Microelectronic Engineering 73-74, pp. 152-156 Jan. 1, 2004.
Kawata et al., Imprint/Photo Hybrid Litography Using Conventional Contact Aligner, Japanese Journal of Applied Physics, vol. 43, No. 6B, pp. 4027-4030 Jun. 29, 2004.
Kim et al., Reducing Photocurable Polymer Pattern Shrinkage and Roughness during Dry Etching in Photo-Nanoimprint Litography, Japanese Journal of Applied Physics, vol. 43, No. 6B, pp. 4022-4026 Jun. 29, 2004.
Abstract of Japanese Patent 58-129074, Aug. 1, 1983.
Chou et al., Ultrafast and Direct Imprint of Nanostructures in Silicon, Nature, Col. 417, pp. 835-837 Jun. 1, 2002.
Chou et al., Nanoimprint Lithography, Journal of Vacuum Science Technolgoy B 14(16), pp. 4129-4133 Nov. 1, 1996.
Colburn et al., Development and Advantages of Step-and-Flash Lithography, Solid State Technology Jul. 1, 2001.
Colburn et al., Characterization and Modeling of Volumetric and Mechanical Properties for Step and Flash Imprint Lithography Photopolymers, Journal of Vacuum Science Technology. vol. b. 19(6) Nov. 1, 2001.
Wilson et al., Lithography and Etch Issues, Handbook of Multilevel Metallization for Integrated Circuits, pp. 566-567 Jan. 1, 1993.
Bailey et al., Step and Flash Imprint Lithography: Defect Analysis, Journal of Vacuum Science, B 19(6), pp. 2806-2810 Nov. 1, 2001.
Bailey et al., Step and Flash Imprint Lithography: Template Surface Treatment and Defect Analysis, Journal of Vacuum Science, B 18(6), pp. 3572-3577 Nov. 1, 2000.
Schneider et al., Stripes of Partially Fluorinated Alkyl Chains: Dipolar Langmuir Monolayers, J. Chem. Phys. vol. 122, Issue 9 Mar. 1, 2005.
Park et al., Aligning Liquid Crystals Using Replicated Nanopatterns, Psi Scientific Report 2002, vol. VII, p. 85 Mar. 1, 2003.
McMackin et al., Design and Performance of a Step and Repeat Imprinting Machine, SPIE Microltihgraphy Conference Feb. 1, 2003.
Le et al., Development of an Etch-Definable Lift-Off Process for Use with Step and Flash Imprint Lithography, SPIE Microlithography Conference Feb. 1, 2005.
Cardinale et al, Fabrication of a Surface Acoustic Wave-Based Correlator Using Step-and-Flash Imprint Lithography, J. Vac. Sci. Technol. B 22(6) Nov. 1, 2004.
Abstract of Japanese Patent 3-32888, Feb. 13, 1991.
Abstract of French Patent 2677043, Dec. 1, 1992.
Colburn et al., Dissertation for the Degree of Doctor of Philosophy, Step and Flash Imprint Lithography: A Low-Pressure, Room-Temperature Nanoimprint Lithography Aug. 1, 2001.
U.S. Appl. No. 11/693,236, naming Inventors Schmid et al., entitled Self-Aligned Process for Fabricating Imprint Templates Containing Variously Etched Features, filed Mar. 29, 2007.
Thurn et al., Stress Hysterisis and Mechanical Properties of Plasma-Enhanced Chemical Vapor Deposited Dielectric Films, Journal of Applied Physics, vol. 95, No. 3, pp. 967976 Feb. 1, 2004.
Modreanu et al., Optical Properties of LPCVD Silicon Oxynitride, Thin Solid Films 337, pp. 82-84.
Abstract of Japanese patent 02-192045, Jul. 27, 1990.
Casey et al, Control of Metal Deposition in a Web Coater, Controlling in both Transverse and Machine Direction, Proceedings, Annual Technical Conference—Society of Vacuum Coaters, May 4, 1990.
Lu et al., The Effect of Deposition Parameters on Performance of VME-FPC, Proceedings of the IEEE International Vacuum Microelectronics Conference, IVMC, Aug. 16, 2001.
Nerac.Com Retro Search, Fluid Dispensing, May 4, 2005.
Casey et al., Control of Metal Deposition in a Web Coater, Controlling in both Transverse and Machine Direction, Society of Vacuum Coaters 33$^{rd}$ Annual Technical Proceedings, May 4, 1990.
Lu et al. The Effect of Deposition Parameters on Performance of VME-FPC, IEEE Conference Publication Aug. 16, 2001.

* cited by examiner

PATTERNING A PLURALITY OF FIELDS ON A SUBSTRATE TO COMPENSATE FOR DIFFERING EVAPORATION TIMES

CROSS-REFERENCE TO RELATED APPLICATION

The present application claims priority to U.S. Provisional Application No. 60/788,782, filed on Apr. 3, 2006, entitled "Pre-dispense of Liquid for High-Throughput Step and Repeat Imprint Lithography," which is incorporated herein by reference.

BACKGROUND INFORMATION

Nano-fabrication involves the fabrication of very small structures, e.g., having features on the order of nanometers or smaller. One area in which nano-fabrication has had a sizeable impact is in the processing of integrated circuits. As the semiconductor processing industry continues to strive for larger production yields while increasing the circuits per unit area formed on a substrate, nano-fabrication becomes increasingly important. Nano-fabrication provides greater process control while allowing increased reduction of the minimum feature dimension of the structures formed. Other areas of development in which nano-fabrication has been employed include biotechnology, optical technology, mechanical systems and the like.

An exemplary nano-fabrication technique is commonly referred to as imprint lithography. Exemplary imprint lithography processes are described in detail in numerous publications, such as United States patent application publication 2004/0065976 filed as U.S. patent application Ser. No. 10/264,960, entitled "Method and a Mold to Arrange Features on a Substrate to Replicate Features having Minimal Dimensional Variability"; United States patent application publication 2004/0065252 filed as U.S. patent application Ser. No. 10/264,926, entitled "Method of Forming a Layer on a Substrate to Facilitate Fabrication of Metrology Standards"; and U.S. Pat. No. 6,936,194, entitled "Functional Patterning Material for Imprint Lithography Processes," all of which are assigned to the assignee of the present invention.

The imprint lithography technique disclosed in each of the aforementioned United States patent application publications and United States patent includes formation of a relief pattern in a polymerizable layer and transferring a pattern corresponding to the relief pattern into an underlying substrate. The substrate may be positioned upon a stage to obtain a desired position to facilitate patterning thereof To that end, a mold is employed spaced-apart from the substrate with a formable liquid present between the mold and the substrate. The liquid is solidified to form a patterned layer that has a pattern recorded therein that is conforming to a shape of the surface of the mold in contact with the liquid. The mold is then separated from the patterned layer such that the mold and the substrate are spaced-apart. The substrate and the patterned layer are then subjected to processes to transfer, into the substrate, a relief image that corresponds to the pattern in the patterned layer.

DETAILED DESCRIPTION

Figure 1:
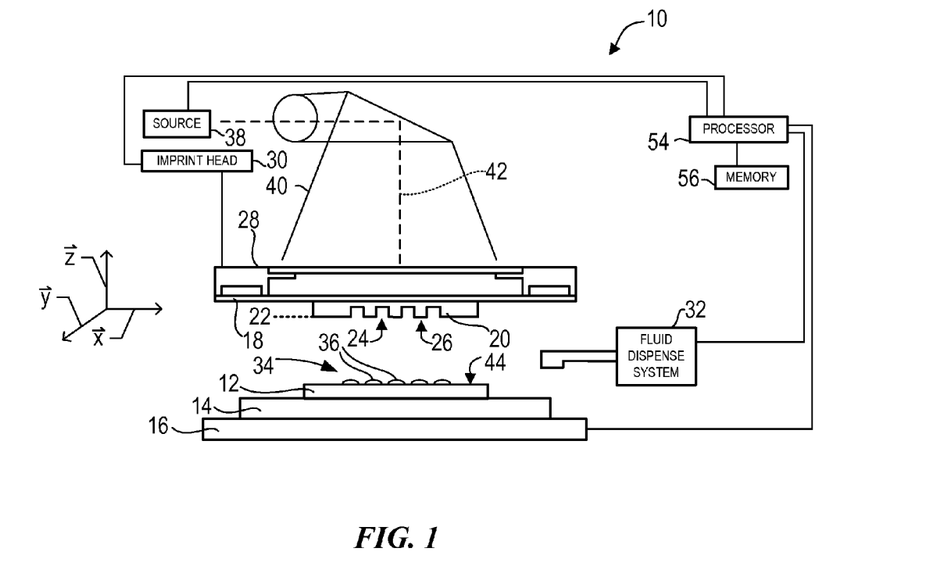
FIG. 1 is a simplified side view of a lithographic system having a template spaced-apart from a substrate.

Referring to FIG. 1, a system 10 to form a relief pattern on a substrate 12 is shown. Substrate 12 may be coupled to a substrate chuck 14. Substrate chuck 14 may be any chuck including, but not limited to, vacuum, pin-type, groove-type, or electromagnetic, as described in U.S. Pat. No. 6,873,087 entitled "High-Precision Orientation Alignment and Gap Control Stages for Imprint Lithography Processes," which is incorporated herein by reference. Substrate 12 and substrate chuck 14 may be supported upon a stage 16. Further, stage 16, substrate 12, and substrate chuck 14 may be positioned on a base (not shown). Stage 16 may provide motion about the x and y axes.

Spaced-apart from substrate 12 is a template 18 having a mold 20 extending therefrom towards substrate 20 with a patterning surface 22 thereon. Further, mesa 20 may be referred to as a mold 20. Mesa 20 may also be referred to as a nanoimprint mold 20. In a further embodiment, template 18 may be substantially absent of mold 20. Template 18 and/or mold 20 may be formed from such materials including but not limited to, fused-silica, quartz, silicon, organic polymers, siloxane polymers, borosilicate glass, fluorocarbon polymers, metal, and hardened sapphire. As shown, patterning surface 22 comprises features defined by a plurality of spaced-apart recesses 24 and protrusions 26. However, in a further embodiment, patterning surface 22 may be substantially smooth and/or planar. Patterning surface 20 may define an original pattern that forms the basis of a pattern to be formed on substrate 12.

Template 18 may be coupled to a template chuck 28, template chuck 28 being any chuck including, but not limited to, vacuum, pin-type, groove-type, or electromagnetic, as described in U.S. Pat. No. 6,873,087 entitled "High-Precision Orientation Alignment and Gap Control Stages for Imprint Lithography Processes". Template chuck 28 may be coupled to an imprint head 30 to facilitate movement of template 18 and mold 20.

System 10 further comprises a fluid dispense system 32. Fluid dispense system 32 may be in fluid communication with substrate 12 so as to deposit a polymeric material 34 thereon. System 10 may comprise any number of fluid dispensers and fluid dispense system 32 may comprise a plurality of dispensing units therein. Polymeric material 34 may be positioned upon substrate 12 using any known technique, e.g., drop dispense, spin-coating, dip coating, chemical vapor deposition (CVD), physical vapor deposition (PVD), thin film deposition, thick film deposition, and the like. As shown, polymeric material 34 may be deposited upon substrate 12 as a plurality of spaced-apart droplets 36. Typically, polymeric material 34 is disposed upon substrate 12 before the desired volume is defined between mold 20 and substrate 12. However, polymeric material 34 may fill the volume after the desired volume has been obtained.

Figure 2:
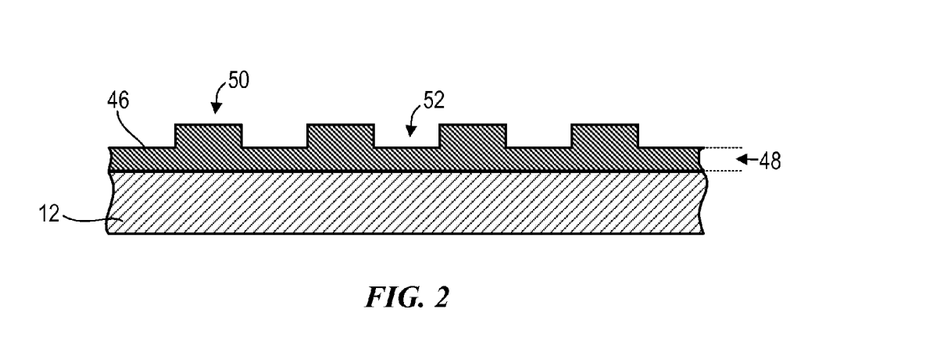
FIG. 2 is a simplified side view of the substrate shown in FIG. 1, having a patterned layer positioned thereon.

Referring to FIGS. 1 and 2, system 10 further comprises a source 38 of energy 40 coupled to direct energy 40 along a path 42. Imprint head 30 and stage 16 are configured to arrange mold 20 and substrate 12, respectively, to be in superimposition and disposed in path 42. Either imprint head 30, stage 16, or both vary a distance between mold 20 and substrate 12 to define a desired volume therebetween such that mold 20 contacts polymeric material 34 and the desired volume is filled by polymeric material 34. More specifically, polymeric material 34 of droplets 36 may ingress and fill recesses 24 of mold 20. After the desired volume is filled with polymeric material 34, source 38 produces energy 40, e.g., broadband ultraviolet radiation that causes polymeric material 34 to solidify and/or cross-link conforming to the shape of a surface 44 of substrate 12 and patterning surface 22, defining a patterned layer 46 on substrate 12. Patterned layer 46 may comprise a residual layer 48 and a plurality of features shown as protrusions 50 and recessions 52. System 10 may be regulated by a processor 54 that is in data communication with stage 16, imprint head 30, fluid dispense system 32, and source 38, operating on a computer readable program stored in memory 56.

Figure 3:
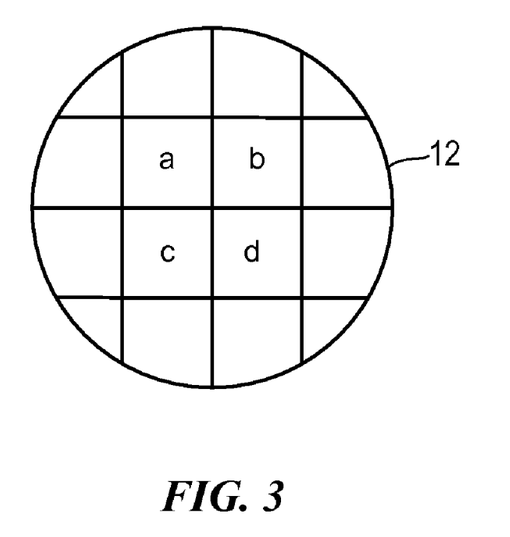
FIG. 3 is a top down view of the substrate shown in FIG. 1 showing a plurality of fields in a first embodiment.

Referring to FIGS. 1 and 3, substrate 12 may comprise a plurality of fields, shown as fields a-d. However, in a further embodiment, substrate 12 may comprise any number of fields. Each of fields a-d of substrate 12 may be subjected to the aforementioned patterning process. In a first embodiment, all of fields a-d of substrate 12 may have polymeric material 34 positioned thereon concurrently by fluid dispense system 32. In a further embodiment, polymeric material 34 may be positioned on fields a-d of substrate 12 sequentially by fluid dispense system 32. Fields a-d of substrate 12 may have a volume $V_{dispense}$ positioned thereon by fluid dispense system 32.

Polymeric material 34 positioned on each of fields a-d of substrate 12 may fill the desired volume between mold 20 and substrate 12, and more specifically, ingress and fill recesses 24 of mold 20, as described above. Mold 20 may contact polymeric material 34 positioned on each of fields a-d of substrate 12 sequentially. More specifically, mold 20 may contact polymeric material 34 positioned on field a of substrate 12 prior to contacting fields b-d of substrate 12; mold 20 may contact polymeric material 34 positioned on field b of substrate 12 after contacting field a of substrate 12 and prior to contacting fields c-d of substrate 12 contact mold 20; mold 20 may contact polymeric material 34 positioned on field c of substrate 12 after contacting field b of substrate 12 and prior to contacting field d of substrate 12; and mold 20 may contact polymeric material 34 positioned on field d of substrate 12 after contacting field c of substrate 12. In a further embodiment, any desired sequential order of contacting polymeric material 34 on fields a-d of substrate may be employed.

As a result of mold 20 contacting polymeric material 34 positioned on fields a-d of substrate 12 sequentially, each of fields a-d of substrate 12 may be subjected to differing evaporation times. More specifically, a time between positioning polymeric material 34 on a field a-d of substrate 12 and mold 20 contacting polymeric material 34 on the field a-d of substrate 12 may be referred to as an "evaporation time" of polymeric material 34 positioned on the field a-d of substrate 12. To that end, a volume of polymeric material 34 positioned on a field a-d of substrate 12 upon contact with mold 20 may differ from a volume of polymeric material 34 positioned on the field a-d of substrate 12 by fluid dispense system 32. This may result from, inter alia, the evaporation time associated with fields a-d of substrate 12. To that end, polymeric material 34 positioned on field a of substrate 12 may have a first evaporation time $T_a$ associated therewith resulting in the volume of polymeric material 34 positioned on field a upon contact with mold 20 being $V_{evapA}$, with $V_{evapA}$ being less than $V_{dispense}$; polymeric material 34 positioned on field b of substrate 12 may have a second evaporation time $T_b$ associated therewith resulting in the volume of polymeric material 34 positioned on field b upon contact with mold 20 being $V_{evapB}$, with $V_{evapB}$ being less than $V_{dispense}$; polymeric material 34 positioned on field c of substrate 12 may have a third evaporation time $T_c$ associated therewith resulting in the volume of polymeric material 34 positioned on field c upon contact with mold 20 being $V_{evapC}$, with $V_{evapC}$ being less than $V_{dispense}$; and polymeric material 34 positioned on field d of substrate 12 may have a fourth evaporation time $T_d$ associated therewith resulting in the volume of polymeric material 34 positioned on field d upon contact with mold 20 being $V_{evapD}$, with $V_{evapD}$ being less than $V_{dispense}$.

As mentioned above, mold 20 contacts fields a-d of substrate 12 sequentially. Thus, polymeric material 34 on a first subset of fields a-d of substrate 12 that are contacted by mold 20 subsequent to polymeric material 34 on a second subset of fields a-d of substrate 12, differing from the first subset, being contacted by mold 20 will have a greater evaporation time associated therewith. More specifically, evaporation time $T_b$ may be greater than evaporation time $T_a$; evaporation time $T_c$ may be greater than evaporation time $T_b$; and evaporation time $T_d$ may be greater than evaporation time $T_c$. In summary, evaporation times $T_a$, $T_b$, $T_c$, and $T_d$ may be defined as follows:

$$T_d > T_c > T_b > T_a. \tag{1}$$

As a result of the evaporation time being greater for polymeric material 34 on the aforementioned first subset of fields a-d of substrate 12 compared to the evaporation time for polymeric material 34 on the aforementioned second subset of fields a-d of substrate 12, the volume of polymeric material 34 on the aforementioned second subset of fields a-d of substrate 12 upon contact with mold 20 will be greater than the volume of polymeric material 34 on the aforementioned first subset of fields a-d of substrate 12 upon contact with mold 20. More specifically, volume $V_{evapA}$ of polymeric material 34 on field a of substrate 12 upon contact with mold 20 is greater than $V_{evapB}$ of polymeric material 34 on field b of substrate 12 upon contact with mold 20; volume $V_{evapB}$ of polymeric material 34 on field b of substrate 12 upon contact with mold 20 is greater than $V_{evapC}$ of polymeric material 34 on field c of substrate 12 upon contact with mold 20; and volume $V_{evapC}$ of polymeric material 34 on field c of substrate 12 upon contact with mold 20 is greater than $V_{evapD}$ of polymeric material 34 on field d of substrate 12 upon contact with mold 20. In summary, volumes $V_{evapA}$, $V_{evapB}$, $V_{evapC}$, and $V_{evapD}$, of polymeric material 34 on fields a, b, c, and d, respectively, of substrate 12, upon contact with mold 20, may be defined as follows:

$$V_{evapA} > V_{evapB} > V_{evapC} > V_{evapD}. \tag{2}$$

Referring to FIGS. 1-3, to that end, contacting polymeric material 34 positioned on fields a-d of substrate 12 with mold 20 each having a differing volume associated therewith, may result in pattern distortion of features formed from polymeric material 34 in patterned layer 46; low fidelity of features form from polymeric material 34 in patterned layer 46, and a non-uniform thickness of residual layer 48 across patterned layer 46, all of which are undesirable.

Referring to FIGS. 1 and 3, to compensate for the evaporation of polymeric material 34 positioned on fields a-d of substrate 12, the volume $V_{dispense}$ positioned on each of fields a-d of substrate 12 by fluid dispense system 32 may be varied. More specifically, the volume Of $V_{dispense}$ positioned on the aforementioned first subset of fields a-d of substrate 12 by fluid dispense system 32 may be increased as compared to the volume $V_{dispense}$ positioned on the aforementioned second subset of fields a-d of substrate 12 by fluid dispense system 32. As a result, upon contact with mold 20, each of fields a-d of substrate 12 may have substantially the same volume of polymeric material 34, which may be desired.

More specifically, the volume $V_{dispenseD}$ positioned on field d of substrate 12 by fluid dispense system 32 is greater than the volume $V_{dispenseC}$ positioned on field c of substrate 12 by fluid dispense system 32; the volume $V_{dispenseC}$ positioned on field c of substrate 12 by fluid dispense system 32 is greater than the volume $V_{dispenseB}$ positioned on field b of substrate 12 by fluid dispense system 32; and the volume $V_{dispenseB}$ positioned on field b of substrate 12 by fluid dispense system 32 is greater than the volume $V_{dispenseA}$ positioned on field a of substrate 12 by fluid dispense system 32. In summary, volumes $V_{dispenseA}$, $V_{dispenseB}$, $V_{dispenseC}$, and $V_{dispenseD}$, of polymeric material 34 on fields a, b, c, and d, respectively, positioned on substrate 12 by fluid dispense system 32 may be defined as follows:

$$V_{dispenseD} > V_{dispenseC} > V_{dispenseB} > V_{dispenseA} \quad (3)$$

As a result of positioning polymeric material 32 on field a having a volume $V_{dispenseA}$ and subjecting polymeric material 32 on field a of substrate 12 to evaporation time $T_a$, the volume of polymeric material 32 on field a of substrate 12 upon contact with mold 20 is $V_{finalA}$; as a result of positioning polymeric material 32 on field b having a volume $V_{dispenseB}$ and subjecting polymeric material 32 on field b of substrate 12 to evaporation time $T_b$, the volume of polymeric material 32 on field b of substrate 12 upon contact with mold 20 is $V_{finalB}$; as a result of positioning polymeric material 32 on field c having a volume $V_{dispenseC}$ and subjecting polymeric material 32 on field c of substrate 12 to evaporation time $T_c$, the volume of polymeric material 32 on field c of substrate 12 upon contact with mold 20 is $V_{finalC}$; and as a result of positioning polymeric material 32 on field d having a volume $V_{dispenseD}$ and subjecting polymeric material 32 on field d of substrate 12 to evaporation time $T_d$, the volume of polymeric material 32 on field d of substrate 12 upon contact with mold 20 is $V_{finalD}$. To that end, the volumes $V_{finalA}$, $V_{finalB}$, $V_{finalC}$, and $V_{finalD}$ of polymeric material 32 positioned on fields a, b, c, and d, respectively of substrate upon contact with mold 20 may be all substantially the same.

Referring to FIGS. 1-3, to determine the volumes $V_{dispenseA}$, $V_{dispenseB}$, $V_{dispenseC}$, and $V_{dispenseD}$ of polymeric material 34 positioned on fields a-d of substrate 12, respectively, direct imaging of polymeric material 34 in droplets 40 positioned on each field a-d of substrate 12 may be employed. In a further embodiment, film thickness metrology of patterned layer 46 may be employed.

Referring to FIG. 1, in a further embodiment, after mold 20 contacts polymeric material 34 on a field a-d of substrate 12, source 38 may produce energy 40 to cause polymeric material 34 to be solidified and/or cross-linked, as mentioned above. However, polymeric material 34 positioned on surrounding fields a-d of substrate 12 may be concurrently exposed to energy 40, and thus, may be solidified and/or cross-linked prior to contact with mold 20, which is undesirable. Solidifying and/or cross-linking of polymeric material 34 positioned on the surrounding fields a-d of substrate 12 may result in, inter alia, problematic control of the thickness of subsequently disposed layers on the surrounding fields a-d of substrate 12 and formation of deleterious artifacts in layers formed on the surrounding fields a-d of substrate 12, all of which are undesirable. To that end, a method of patterning substrate 12 to minimize, if not prevent, undesired curing and/or cross-linking of polymeric material 32 on surrounding fields a-d of substrate 12 is described further below.

Figure 4:
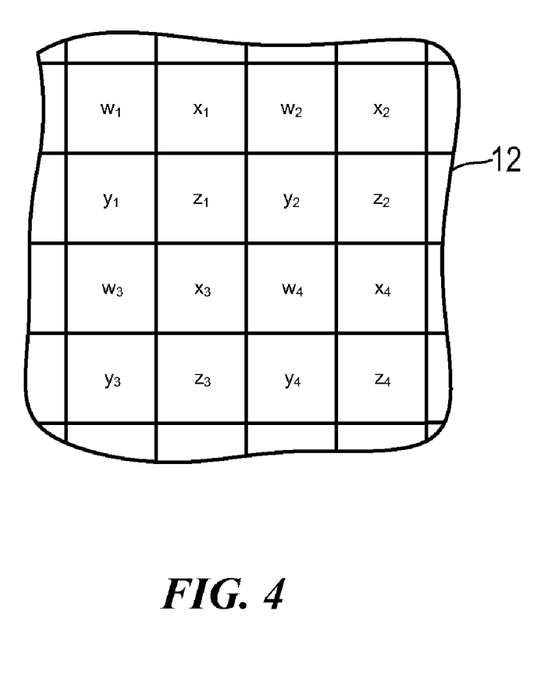
FIG. 4 is a top down view of the substrate shown in FIG. 1 showing a plurality of fields in a second embodiment.

Referring to FIGS. 1 and 4, substrate 12 is shown have a plurality of fields w-z. Each field w-z of substrate 12 comprises a plurality of sub-fields, i.e., field w of substrate 12 comprises sub-fields $w_1$-$w_4$; field x of substrate 12 comprises sub-fields $x_1$-$x_4$; field y of substrate 12 comprises sub-fields $y_1$-$y_4$; and field z of substrate 12 comprises sub-fields $z_1$-$z_4$. Each sub-field of a field w-z of substrate 12 may be spaced-apart from the remaining sub-fields of the field w-z of substrate 12 by the remaining fields w-z of substrate 12. More specifically, each sub-field $w_1$-$w_4$ of field w of substrate 12 may be separated from the remaining sub-fields $w_1$-$w_4$ of field w of substrate 12 by fields x-z; each sub-field $x_1$-$x_4$ of field x of substrate 12 may be separated from the remaining sub-fields $x_1$-$x_4$ of field x of substrate 12 by fields w, y, and z; each sub-field $y_1$-$y_4$ of field y of substrate 12 may be separated from the remaining sub-fields $y_1$-$y_4$ of field y of substrate 12 by fields w, x, and z; and each sub-field $z_1$-$z_4$ of field z of substrate 12 may be separated from the remaining sub-fields $z_1$-$z_4$ of field z of substrate 12 by fields w-y.

Figure 5:
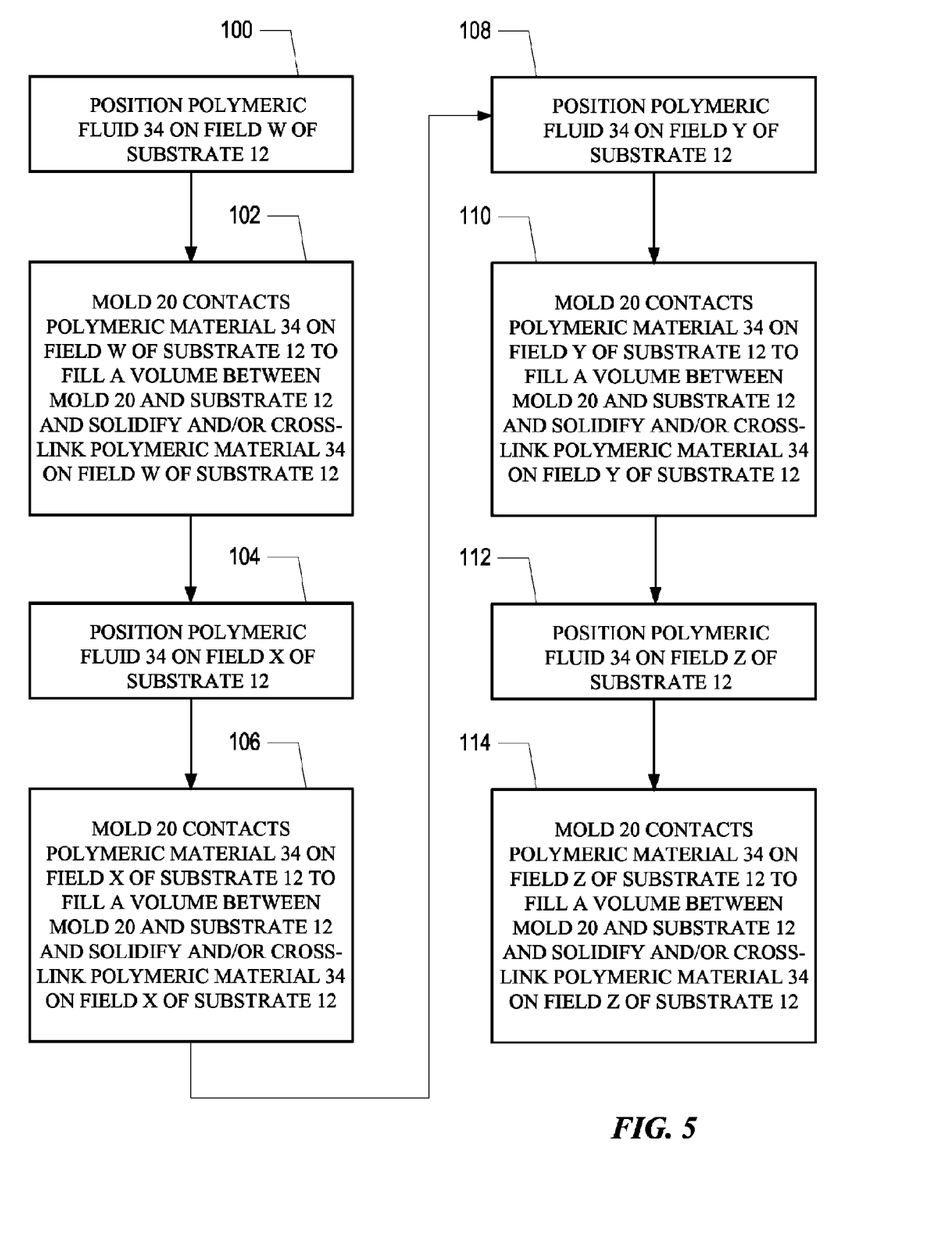
FIG. 5 is a flow diagram showing a method of patterning the plurality of fields of the substrate shown in FIG. 4.

Referring to FIGS. 1, 4, and 5, a process flow for patterning substrate 12 having fields w-z is shown. At step 100, polymeric material 34 may be positioned on field w using any of the techniques mentioned above. Polymeric material 28 may be positioned on field w concurrently by fluid dispense system 32, or in a further embodiment, polymeric material 34 may be positioned on sub-fields $w_1$-$w_4$ of field w of substrate 12 sequentially by fluid dispense system 32.

At step 102, subsequent to positioning polymeric material 34 on field w, mold 20 may contact polymeric material 34 positioned on each sub-field $w_1$-$w_4$ of field w of substrate 12. Mold 20 may contact polymeric material 34 positioned on sub-field $w_1$ of substrate 12 prior to contacting sub-fields $w_2$-$w_4$ of substrate 12, with polymeric material 34 on sub-field $w_1$ of substrate 12 being subsequently solidified or cross-linked; mold 20 may contact polymeric material 34 positioned on sub-field $w_2$ of substrate 12 after contacting sub-field $w_1$ of substrate 12 and prior to contacting sub-fields $w_3$-$w_4$ of substrate 12 with polymeric material 34 on sub-field $w_2$ of substrate 12 being subsequently solidified or cross-linked; mold 20 may contact polymeric material 34 positioned on sub-field $w_3$ of substrate 12 after contacting sub-field $w_2$ of substrate 12 and prior to contacting sub-field $w_4$ of substrate 12 with polymeric material 34 on sub-field $w_3$ of substrate 12 being subsequently solidified or cross-linked; mold 20 may contact polymeric material 28 positioned on sub-field $w_4$ of substrate 12 after contacting sub-field $w_3$ of substrate 12 with polymeric material 34 on sub-field $w_4$ of substrate 12 being subsequently solidified or cross-linked.

At step 104, polymeric material 34 may be positioned on field x using any of the techniques mentioned above. Polymeric material 28 may be positioned on field x concurrently by fluid dispense system 32, or in a further embodiment, polymeric material 34 may be positioned on sub-fields $x_1$-$x_4$ of field x of substrate 12 sequentially by fluid dispense system 32.

At step 106, subsequent to positioning polymeric material 34 on field x, mold 20 may contact polymeric material 34 positioned on each sub-field $x_1$-$x_4$ of field x of substrate 12. Mold 20 may contact polymeric material 34 positioned on sub-field $x_1$ of substrate 12 prior to contacting sub-fields $x_2$-$x_4$ of substrate 12, with polymeric material 34 on sub-field $x_1$ of substrate 12 being subsequently solidified or cross-linked; mold 20 may contact polymeric material 34 positioned on sub-field $x_2$ of substrate 12 after contacting sub-field $x_1$ of substrate 12 and prior to contacting sub-fields $x_3$-$x_4$ of substrate 12 with polymeric material 34 on sub-field $x_2$ of substrate 12 being subsequently solidified or cross-linked; mold 20 may contact polymeric material 34 positioned on sub-field $x_3$ of substrate 12 after contacting sub-field $x_2$ of substrate 12 and prior to contacting sub-field $x_4$ of substrate 12 with polymeric material 34 on sub-field $x_3$ of substrate 12 being subsequently solidified or cross-linked; mold 20 may contact polymeric material 28 positioned on sub-field $x_4$ of substrate 12 after contacting sub-field $x_3$ of substrate 12 with polymeric material 34 on sub-field $x_4$ of substrate 12 being subsequently solidified or cross-linked.

At step 108, polymeric material 34 may be positioned on field y using any of the techniques mentioned above. Polymeric material 28 may be positioned on field y concurrently by fluid dispense system 32, or in a further embodiment, polymeric material 34 may be positioned on sub-fields $y_1$-$y_4$ of field y of substrate 12 sequentially by fluid dispense system 32.

At step 110, subsequent to positioning polymeric material 34 on field y, mold 20 may contact polymeric material 34 positioned on each sub-field $y_1$-$y_4$ of field y of substrate 12. Mold 20 may contact polymeric material 34 positioned on sub-field $y_1$ of substrate 12 prior to contacting sub-fields $y_2$-$y_4$ of substrate 12, with polymeric material 34 on sub-field $y_1$ of substrate 12 being subsequently solidified or cross-linked; mold 20 may contact polymeric material 34 positioned on sub-field $y_2$ of substrate 12 after contacting sub-field $y_1$ of substrate 12 and prior to contacting sub-fields $y_3$-$y_4$ of substrate 12 with polymeric material 34 on sub-field $y_2$ of substrate 12 being subsequently solidified or cross-linked; mold 20 may contact polymeric material 34 positioned on sub-field $y_3$ of substrate 12 after contacting sub-field $y_2$ of substrate 12 and prior to contacting sub-field $y_4$ of substrate 12 with polymeric material 34 on sub-field $y_3$ of substrate 12 being subsequently solidified or cross-linked; mold 20 may contact polymeric material 28 positioned on sub-field $y_4$ of substrate 12 after contacting sub-field $y_3$ of substrate 12 with polymeric material 34 on sub-field $y_4$ of substrate 12 being subsequently solidified or cross-linked.

At step 112, polymeric material 34 may be positioned on field z using any of the techniques mentioned above. Polymeric material 28 may be positioned on field z concurrently by fluid dispense system 32, or in a further embodiment, polymeric material 34 may be positioned on sub-fields $z_1$-$z_4$ of field w of substrate 12 sequentially by fluid dispense system 32.

At step 114, subsequent to positioning polymeric material 34 on field z, mold 20 may contact polymeric material 34 positioned on each sub-field $z_1$-$z_4$ of field z of substrate 12. Mold 20 may contact polymeric material 34 positioned on sub-field $z_1$ of substrate 12 prior to contacting sub-fields $z_2$-$z_4$ of substrate 12, with polymeric material 34 on sub-field $z_1$ of substrate 12 being subsequently solidified or cross-linked; mold 20 may contact polymeric material 34 positioned on sub-field $z_2$ of substrate 12 after contacting sub-field $z_1$ of substrate 12 and prior to contacting sub-fields $z_3$-$z_4$ of substrate 12 with polymeric material 34 on sub-field $z_2$ of substrate 12 being subsequently solidified or cross-linked; mold 20 may contact polymeric material 34 positioned on sub-field $z_3$ of substrate 12 after contacting sub-field $z_2$ of substrate 12 and prior to contacting sub-field $z_4$ of substrate 12 with polymeric material 34 on sub-field $z_3$ of substrate 12 being subsequently solidified or cross-linked; mold 20 may contact polymeric material 28 positioned on sub-field $z_4$ of substrate 12 after contacting sub-field $z_3$ of substrate 12 with polymeric material 34 on sub-field $z_4$ of substrate 12 being subsequently solidified or cross-linked.

The embodiments of the present invention described above are exemplary. Many changes and modifications may be made to the disclosure recited above, while remaining within the scope of the invention. Therefore, the scope of the invention should not be limited by the above description, but instead should be determined with reference to the appended claims along with their full scope of equivalents.

What is claimed is:

1. A method of patterning a substrate comprising a plurality of fields, said method comprising:
    positioning a first volume of fluid on a first subset of said plurality of fields of said substrate, with said first volume of fluid being subjected to a first evaporation time, said first evaporation time being a time between positioning said first volume of fluid on said first subset and patterning said first subset;
    positioning a second volume of fluid on a second subset of said plurality of fields of said substrate, differing from said first subset, with said second volume of fluid differing from said first volume of fluid and being subjected to a second evaporation time, differing from said first evaporation time, said second evaporation time being a time between positioning said second volume of fluid on said second subset and patterning said second subset; and
    patterning using an imprint lithography template said first volume of fluid on said first subset of said plurality of fields defining a first patterned layer on said substrate, the first patterned layer having a volume; and,
    patterning using the imprint lithography template said second volume of fluid on said second subsets of said plurality of fields defining a second patterned layer on said substrate, the second patterned layer having a volume, wherein said first volume of fluid and said second volume of fluid are determined relative to the first and second evaporation times such that said volume associated with said first patterned layer is substantially same as said volume associated with said second patterned layer.

2. The method as recited in claim 1 further including positioning said first and second volumes of fluid on said first and second subsets of said plurality of fields, respectively, concurrently.

3. The method as recited in claim 1 further including positioning said first volume of fluid on said first subset of said plurality of fields prior to positioning said second volume of fluid on said second subset of said plurality of fields.

4. The method as recited in claim 1 wherein the step of patterning further includes contacting said fluid with a mold having a pattern therein.

5. The method as recited in claim 1 wherein a third subset of said plurality of fields, differing from said first and second subsets of said plurality of fields, surrounds said first subset of said plurality of fields, with said third subset being substantially absent of fluid.

6. The method as recited in claim 1 wherein a third subset of said plurality of fields, differing from said first and second subsets of said plurality of fields, surrounds said second subset of said plurality of fields, with said third subset being substantially absent of fluid.

7. The method as recited in claim 1 wherein the step of positioning further includes disposing said fluid as a plurality of droplets.

8. A method of patterning a substrate comprising a plurality of fields, said method comprising:
    positioning a first volume of fluid on a first subset of said plurality of fields of said substrate;
    positioning a second volume of fluid on a second subset of said plurality of fields of said substrate, differing from said first subset with said second volume of fluid being different from said first volume of fluid; and patterning using an imprint lithography template said first volume of fluid on said first subset of said plurality of fields forming a first patterned layer having a first volume; and;

patterning using an imprint lithography template said second volume of fluid on said second subset of said plurality of fields forming a second patterned layer having a second volume, wherein said first volume of fluid and said second volume of fluid are determined relative to a first evaporation time of said first volume of fluid and a second evaporation time of said second volume of fluid such that the first volume associated with said first patterned layer is substantially same as the second volume associated with said second patterned layer.

9. The method as recited in claim 8 further including positioning said first and second volumes of fluid on said first and second subsets of said plurality of fields, respectively, concurrently.

10. The method as recited in claim 8 further including positioning said first volume of fluid on said first subset of said plurality of fields prior to positioning said second volume of fluid on said second subset of said plurality of fields.

11. The method as recited in claim 8 wherein the step of patterning further includes contacting said fluid with a mold having a pattern therein.

12. The method as recited in claim 8 wherein a third subset of said plurality of fields, differing from said first and second subsets of said plurality of fields, surrounds said first subset of said plurality of fields, with said third subset being substantially absent of fluid.

13. The method as recited in claim 8 wherein a third subset of said plurality of fields, differing from said first and second subsets of said plurality of fields, surrounds said second subset of said plurality of fields, with said third subset being substantially absent of fluid.

14. The method as recited in claim 8 wherein the step of positioning further includes disposing said fluid as a plurality of droplets.

15. A method of patterning a substrate comprising a plurality of fields in a nanoimprint lithography system, said method comprising:

positioning a first volume of a nanoimprint fluid on a first subset of said plurality of fields of said substrate, with said first volume being subjected to a first evaporation time, said first evaporation time being a time between positioning said first volume on said first subset and patterning said first subset;

positioning a second volume of a nanoimprint fluid on a second subset of said plurality of fields of said substrate, differing from said first subset, with said second volume being greater than said first volume, with said second volume being subjected to a second evaporation time; and patterning using an imprint lithography template said first volume of nanoimprint fluid on said first subset of said plurality of fields forming a first patterned layer having a first volume; and, patterning using the imprint lithography template said second volume of nanoimprint fluid on said second subset of said plurality of fields forming a second patterned layer having a second volume, wherein said first volume of fluid and said second volume of fluid are determined relative to the first and second evaporation times such that the first volume associated with said first patterned layer is substantially same as the second volume associated with said second patterned layer.

16. The method as recited in claim 15 further including positioning said first and second volumes of said nanoimprint fluid on said first and second subsets of said plurality of fields, respectively, concurrently.

17. The method as recited in claim 15 further including positioning said first volume of said nanoimprint fluid on said first subset of said plurality of fields prior to positioning said second volume of said nanoimprint fluid on said second subset of said plurality of fields.

18. The method as recited in claim 15 wherein the step of patterning further includes contacting said fluid with a nanoimprint mold assembly having a pattern therein.

19. The method as recited in claim 15 wherein a third subset of said plurality of fields, differing from said first and second subsets of said plurality of fields, surrounds said first subset of said plurality of fields, with said third subset being substantially absent of said nanoimprint fluid.

20. The method as recited in claim 15 wherein a third subset of said plurality of fields, differing from said first and second subsets of said plurality of fields, surrounds said second subset of said plurality of fields, with said third subset being substantially absent of said nanoimprint fluid.

21. The method as recited in claim 15 wherein the step of positioning further includes disposing said nanoimprint fluid as a plurality of droplets.

\* \* \* \* \*